US010875283B2

(12) United States Patent
Okimura et al.

(10) Patent No.: US 10,875,283 B2
(45) Date of Patent: Dec. 29, 2020

(54) ADHESIVE LAYER-EQUIPPED LAMINATE, AND FLEXIBLE COPPER-CLAD LAMINATE SHEET AND FLEXIBLE FLAT CABLE USING SAME

(71) Applicant: TOAGOSEI CO., LTD., Tokyo (JP)

(72) Inventors: Yuya Okimura, Nagoya (JP); Masashi Yamada, Nagoya (JP)

(73) Assignee: TOAGOSEI CO., LTD., Tokyo (JP)

( * ) Notice: Subject to any disclaimer, the term of this patent is extended or adjusted under 35 U.S.C. 154(b) by 478 days.

(21) Appl. No.: 15/329,890

(22) PCT Filed: Jul. 21, 2015

(86) PCT No.: PCT/JP2015/070694
§ 371 (c)(1),
(2) Date: Jan. 27, 2017

(87) PCT Pub. No.: WO2016/017473
PCT Pub. Date: Feb. 4, 2016

(65) Prior Publication Data
US 2017/0259544 A1 Sep. 14, 2017

(30) Foreign Application Priority Data
Jul. 31, 2014 (JP) ................. 2014-156726

(51) Int. Cl.
*B32B 27/38* (2006.01)
*C09J 163/00* (2006.01)
(Continued)

(52) U.S. Cl.
CPC ............. *B32B 27/38* (2013.01); *B32B 7/06* (2013.01); *B32B 7/12* (2013.01); *B32B 15/08* (2013.01); *B32B 15/085* (2013.01); *B32B 15/088* (2013.01); *B32B 15/09* (2013.01); *B32B 15/12* (2013.01); *B32B 15/20* (2013.01); *B32B 25/08* (2013.01); *B32B 27/00* (2013.01); *B32B 27/08* (2013.01); *B32B 27/10* (2013.01); *B32B 27/28* (2013.01); *B32B 27/281* (2013.01); *B32B 27/286* (2013.01); *B32B 27/288* (2013.01); *B32B 27/32* (2013.01); *B32B 27/34* (2013.01); *B32B 27/36* (2013.01); *C08L 25/06* (2013.01); *C08L 53/025* (2013.01); *C08L 63/00* (2013.01); *C09J 7/35* (2018.01); *C09J 125/06* (2013.01); *C09J 153/025* (2013.01); *C09J 163/00* (2013.01); *H05K 1/028* (2013.01); *H05K 1/0353* (2013.01); *H05K 1/09* (2013.01); *H05K 3/386* (2013.01); *B32B 2255/10* (2013.01); *B32B 2255/12* (2013.01); *B32B 2255/26* (2013.01); *B32B 2307/204* (2013.01); *B32B 2307/546* (2013.01); *B32B 2307/732* (2013.01); *B32B 2307/748* (2013.01); *B32B 2309/105* (2013.01); *B32B 2457/08* (2013.01); *C09J 125/10* (2013.01); *C09J 2203/326* (2013.01); *C09J 2301/414* (2020.08); *C09J 2400/163* (2013.01); *C09J 2425/00* (2013.01); *C09J 2453/00* (2013.01); *C09J 2463/00* (2013.01); *C09J 2479/086* (2013.01); *H05K 3/022* (2013.01); *H05K 2201/0154* (2013.01); *H05K 2201/0158* (2013.01)

(58) Field of Classification Search
CPC ..................................................... B32B 27/38
See application file for complete search history.

(56) References Cited

U.S. PATENT DOCUMENTS

| | | | | |
|---|---|---|---|---|
| 5,532,105 | A * | 7/1996 | Yamadera | G03F 7/095 430/156 |
| 6,399,277 | B1 * | 6/2002 | Nojima | G03F 7/032 430/280.1 |

(Continued)

FOREIGN PATENT DOCUMENTS

| | | |
|---|---|---|
| CA | 2652978 | 11/2007 |
| CN | 1715353 A | 1/2006 |

(Continued)

OTHER PUBLICATIONS

English language machine translation of JP 2002-088332 (Year: 2002).*
English language machine translation of JP 2007-002121 (Year: 2007).*
International Search Report for PCT/JP2015/070694 dated Oct. 20, 2015; English translation submitted herewith (4 pages).
JPO Office Action apparently dated Jan. 15, 2019 issued in JP Patent Application No. 2018-086615.
JPO Office Action apparently dated Jan. 15, 2019 issued in JP Patent Application No. 2018-08618.
JPO Office Action apparently dated Jan. 16, 2019 issued in JP Patent Application No. 2016-538280.
Taiwan PO Office Action apparently dated Jan. 24, 2019 issued apparently in TW Application No. 104124324.

(Continued)

*Primary Examiner* — Megan McCulley
(74) *Attorney, Agent, or Firm* — Fitch, Even, Tabin & Flannery, LLP

(57) ABSTRACT

A laminate having an adhesive layer, which exhibits excellent adhesion to base films made from polyimide resins and the like or copper foils, as well as superior electrical properties, and also providing a laminate having an adhesive layer, which is low in warpage when the adhesive layer is in B stage, and which is excellent in storage stability of the laminate. The laminate having an adhesive layer includes a base film and an adhesive layer formed on at least one of the surfaces of the base film, in which the adhesive layer is formed of an adhesive composition comprising a carboxyl group-containing styrene based elastomer and an epoxy resin, wherein the content of the carboxyl group-containing styrene based elastomer is 50 parts by mass or more relative to 100 parts by mass of the solid content of the adhesive composition; the content of the epoxy resin is from 1 to 20 parts by mass relative to 100 parts by mass of the carboxyl group-containing styrene based elastomer; and the adhesive layer is in B-stage.

23 Claims, No Drawings

(51) Int. Cl.
| | |
|---|---|
| *B32B 27/00* | (2006.01) |
| *B32B 25/08* | (2006.01) |
| *B32B 15/08* | (2006.01) |
| *C09J 125/06* | (2006.01) |
| *C08L 63/00* | (2006.01) |
| *C09J 7/35* | (2018.01) |
| *H05K 3/38* | (2006.01) |
| *C09J 153/02* | (2006.01) |
| *C08L 53/02* | (2006.01) |
| *C08L 25/06* | (2006.01) |
| *B32B 15/12* | (2006.01) |
| *B32B 27/28* | (2006.01) |
| *B32B 27/34* | (2006.01) |
| *B32B 27/10* | (2006.01) |
| *B32B 15/085* | (2006.01) |
| *B32B 15/20* | (2006.01) |
| *B32B 15/09* | (2006.01) |
| *B32B 27/08* | (2006.01) |
| *B32B 27/36* | (2006.01) |
| *B32B 15/088* | (2006.01) |
| *B32B 7/06* | (2019.01) |
| *B32B 7/12* | (2006.01) |
| *B32B 27/32* | (2006.01) |
| *H05K 1/02* | (2006.01) |
| *H05K 1/03* | (2006.01) |
| *H05K 1/09* | (2006.01) |
| *H05K 3/02* | (2006.01) |
| *C09J 125/10* | (2006.01) |

(56) References Cited

U.S. PATENT DOCUMENTS 7,576,156 B2 * 8/2009 Ishiguro ............... C09J 133/04
524/474
2005/0287363 A1 12/2005 Ring et al.
2007/0003763 A1 * 1/2007 Kamo .................. C08J 5/18
428/411.1
2007/0246249 A1 * 10/2007 Kano ................... G03F 7/0045
174/257
2013/0295287 A1 * 11/2013 Tsukamoto ............ H05K 3/387
427/304
2016/0222192 A1 * 8/2016 Takashima ............. C09J 109/06

FOREIGN PATENT DOCUMENTS

| JP | H10-7996 A | 1/1998 |
|---|---|---|
| JP | 2002-88332 A | 3/2002 |
| JP | 2006-9015 A | 1/2006 |
| JP | 2007-2121 A | 1/2007 |
| JP | 2007-51195 A | 3/2007 |
| JP | 2009-537689 A | 10/2009 |
| JP | 2011-68713 A | 4/2011 |
| WO | 2006/090715 A1 | 8/2006 |
| WO | 2012/011265 A1 | 1/2012 |

OTHER PUBLICATIONS

Office Action issued against corresponding Chinese Patent Application No. 201580040206.X, apparently dated Jun. 3, 2020 (5 pages).
SIPO, First Office Action, apparently dated Aug. 5, 2019, issued re PRC application 201580040206.X.
SIPO, Second Office Action, apparently dated Mar. 12, 2020, issued re PRC application 201580040206.X.
JPCA Standard, Flexible Printed Wiring Boards and Material for Flexible Printed Wiring Boards—Part II Integrated Standard—, JPCA-DG04-2012, dated Dec. 2011, published by Japan Electronics Packaging and Circuits Association; partial English translation (129 pages).
JPCA Standard, Text methods of copper-clad laminates for flexible printed wiring boards, JPCA-TM0002-2009, dated Jun. 2009, by Japan Electronics Packaging and Circuits Association; partial English translation (41 pages).

* cited by examiner

ADHESIVE LAYER-EQUIPPED LAMINATE, AND FLEXIBLE COPPER-CLAD LAMINATE SHEET AND FLEXIBLE FLAT CABLE USING SAME

CROSS-REFERENCE TO RELATED APPLICATIONS

This application is a U.S. national phase application filed under 35 U.S.C. § 371 of International Application No. PCT/JP2015/070694, filed Jul. 21, 2015, designating the United States, which claims priority from Japanese Patent Application No. 2014-156726, filed Jul. 21, 2014, and the complete disclosures of which applications are hereby incorporated herein by reference in their entirety for all purposes.

TECHNICAL FIELD

The present invention relates to a laminate having an adhesive layer. In further detail, it relates to a laminate having an adhesive layer, which is suitable for use in bonding electronic parts and the like, particularly for manufacturing products related to flexible printed circuits (hereinafter simply referred to as "FPC").

BACKGROUND ART

As electronic devices become more compact and lightweight, the need for bonding electronic parts and the like is diversifying and the demand for the laminate having an adhesive layer is increasing. For instance, as the products related to FPC which is one of the electronic parts, there can be mentioned a flexible copper clad laminate in which a copper foil is bonded to a polyimide film; a flexible printed circuit in which an electronic circuit is formed on the flexible copper clad laminate; a reinforced flexible printed circuit in which the flexible printed circuit is bonded to a reinforcing board; a multilayered board having the flexible copper clad laminate layered on and bonded to the flexible printed circuit board; a flexible flat cable (hereinafter simply referred to as "FFC") comprising copper wiring bonded to a base film, and the like. When these electronic parts are manufactured, the laminate having an adhesive layer is used.

More specifically, when the FPC is manufactured, a "coverlay film" which is a laminate having an adhesive layer is generally used for protecting wired portions. The coverlay film consists of an insulating resin layer and an adhesive layer formed thereon, and a polyimide resin composition is widely used for forming the insulating resin layer. In manufacturing the flexible printed circuits, the coverlay film is bonded to the surface having wired portions thereon via the adhesive layer by use of, for instance, a heat press. In this instance, the adhesive layer of the coverlay film is required to establish a strong adhesion to both the wired portions and the base film.

As adhesives for use in the FPC related products, there have been proposed epoxy-based adhesive compositions containing a thermoplastic resin highly reactive with the epoxy resin. For instance, Patent Document 1 discloses an adhesive sheet having an adhesive layer formed of an adhesive composition comprising a carboxylic acid-modified block copolymer, an epoxy compound having a glycidylamino group and at least three epoxy groups in molecule, and an epoxy resin having two or more epoxy groups in molecule. Furthermore, Patent Document 2 discloses a coverlay film having an adhesive layer formed of an adhesive that is based on a styrene-maleic acid copolymer and an epoxy resin.

Furthermore, in the field of mobile communication equipment such as mobile phones and information terminal devices which are now rapidly increasing in demand, higher frequency signals are used to process a huge amount of data at high speed. Accordingly, with the increase in signal speed and signal frequency, the adhesive for use in FPC-related products must satisfy electrical properties in the high frequency region (i.e, low dielectric constant and low dielectric loss tangent). To cope with such demands in electrical properties, for example, Patent Document 3 discloses a coverlay film comprising a vinyl compound, a polystyrene-poly(ethylene/butylene) block copolymer, an epoxy resin, and a curing catalyst.

CONVENTIONAL TECHNICAL DOCUMENTS

Patent Documents

Patent Document 1: Japanese Patent Publication (Laid-open) No. 2002-88332.
Patent Document 2: Japanese Patent Publication (Laid-open) No. 2007-2121.
Patent Document 3: Japanese Patent Publication (Laid-open) No. 2011-68713.

SUMMARY OF INVENTION

Problems to be Solved by the Invention

However, the thermosetting adhesive sheet disclosed in Patent Document 1 is problematic in that it is inferior in storage stability in the adhesive sheet state. The coverlay film disclosed in Patent Document 2 is still unsatisfactory because the electrical properties in the ultra high frequency microwave region (1 to 3 GHz) are poor. Furthermore, the coverlay film disclosed in Patent Document 3 sometimes warps before thermosetting (in B stage), and it therefore suffers from the problem of bad workability during the FPC production process. A thinner base film is required to improve the electrical properties, however, even when the base film is made thinner, it is still desired that the warpage of the laminate having the adhesive layer is suppressed.

The present invention has been made in light of the above described problems, and aims at providing a laminate having an adhesive layer, which exhibits a strong adhesion to base films made from polyimide resins and the like or copper foils, while exhibiting superior electrical properties. Another objective is to provide a laminate having an adhesive layer, which is low in warpage when the adhesive layer is in B stage, and which is excellent in storage stability of the laminate.

Means for Solving the Problems

The present inventors have found that a laminate having an adhesive layer, which comprises a base film and an adhesive layer, exhibits not only excellent adhesiveness but also little warpage and excellent storage stability when the adhesive layer is formed of an adhesive composition containing specific amounts of a carboxyl group-containing styrene based elastomer and an epoxy resin, and further is in B-stage. The present invention has been accomplished based on these findings.

Thus, a laminate having an adhesive layer according to the present invention and a flexible copper clad laminate using the same are described as follows.

1. A laminate having an adhesive layer, which comprises a base film and an adhesive layer formed on at least one of the surfaces of the base film, in which the adhesive layer is formed of an adhesive composition comprising a carboxyl group-containing styrene based elastomer (A) and an epoxy resin (B), wherein the content of the carboxyl group-containing styrene based elastomer (A) is 50 parts by mass or more relative to 100 parts by mass of the solid content of the adhesive composition, the content of the epoxy resin (B) is 1 to 20 parts by mass relative to 100 parts by mass of the carboxyl group-containing styrene based elastomer (A), and the adhesive layer is in B-stage.

2. The laminate having an adhesive layer, according to the above item 1, wherein the adhesive layer is formed by coating a resin varnish comprising the aforementioned adhesive composition and a solvent on a surface of the base film to form a resin varnish layer, and then removing the solvent from the resin varnish layer.

3. The laminate having an adhesive layer, according to the above items 1 or 2, which has a ratio (H/L) of less than 0.05 wherein H is an elevation of an edge of the laminate and L is a side length of the laminate when the laminate having an adhesive layer is square-shaped and placed on a horizontal surface with the adhesive layer facing up.

4. The laminate having an adhesive layer, according to any one of the above items 1 to 3, wherein the base film is at least one film selected from the group consisting of a polyimide film, a polyether ether ketone film, a polyphenylene sulfide film, an aramid film, a polyethylene naphthalate film, a liquid crystal polymer film, a polyethylene terephthalate film, a polyethylene film, a polypropylene film, a silicone-treated release paper, a polyolefin resin-coated paper, a TPX film, and a fluororesin film.

5. The laminate having an adhesive layer, according to any one of the above items 1 to 4, wherein the thickness of the base film is 5 to 100 µm.

6. The laminate having an adhesive layer, according to any one of the above items 1 to 5, wherein the acid value of the carboxyl group-containing styrene based elastomer (A) is 0.1 to 25 mg KOH/g.

7. The laminate having an adhesive layer, according to any one of the above items 1 to 6, wherein the carboxyl group-containing styrene based elastomer (A) is obtained by modifying at least one styrene-based elastomer selected from the group consisting of styrene-butadiene block copolymers, styrene-ethylenepropylene block copolymers, styrene-butadiene-styrene block copolymers, styrene-isoprene-styrene block copolymers, styrene-ethylenebutylene-styrene block copolymers, and styrene-ethylenepropylene-styrene block copolymers with an unsaturated carboxylic acid.

8. The laminate having an adhesive layer, according to any one of the above items 1 to 7, wherein the epoxy resin (B) is an epoxy resin having no glycidylamino group.

9. The laminate having an adhesive layer, according to any one of the items 1 to 8, wherein the epoxy resin (B) is a multifunctional epoxy resin having an alicyclic structure.

10. The laminate having an adhesive layer, according to any one of the above items 1 to 9, wherein the thickness of the adhesive layer is 5 to 100 µm.

11. The laminate having an adhesive layer, according to any one of the above items 1 to 10, wherein the thickness of the adhesive layer is equal to or thicker than the thickness of the base film.

12. The laminate having an adhesive layer, according to any one of the above items 1 to 11, which exhibits a dielectric constant lower than 3.0 and a dielectric loss tangent lower than 0.01, as measured at a frequency of 1 GHz after curing the adhesive layer.

13. A flexible copper clad laminate which comprises a laminate having an adhesive layer according to any one of the above items 1 to 12 and a copper foil bonded onto the adhesive layer of the laminate.

14. A flexible flat cable which comprises a laminate having an adhesive layer according to any one of the above items 1 to 12 and a copper wiring bonded onto the adhesive layer of the laminate.

Effect of the Invention

The laminate having an adhesive layer according to the present invention is excellent in adhesion to base films made from polyimide resins and the like or copper foils, resin flow, and electrical properties (such as low dielectric constant and low dielectric loss tangent). The present laminate having the adhesive layer shows little warpage, and thus exhibits excellent workability in the manufacturing processes of various types of components, and favorable storage stability of the laminates. Accordingly, the laminate having the adhesive layer of the present invention is suitable for manufacture and the like of the FPC-related products.

DESCRIPTION OF EMBODIMENTS

Embodiments of the present invention will be explained below; however, the present invention is not limited thereto.

1. Laminate Having an Adhesive Layer

The laminate having an adhesive layer according to the present invention comprises a base film and an adhesive layer formed on at least one of the surfaces of the base film, in which the adhesive layer is formed of an adhesive composition comprising specific amounts of a carboxyl group-containing styrene based elastomer (A) and an epoxy resin (B), and the adhesive layer is in B-stage. Specific matters that define the present invention are described in detail below.

(1) Base Film

The base film used in the present invention can be selected depending on the usage of the laminate having an adhesive layer. When the laminate having an adhesive layer is used as a coverlay film, examples of the base film include a polyimide film, a polyether ether ketone film, a polyphenylene sulfide film, an aramid film, a polyethylene naphthalate film, and a liquid crystal polymer film. Preferred among them from the viewpoint of adhesiveness and electrical properties are a polyimide film, a polyethylene naphthalate film, and a liquid crystal polymer film.

The aforementioned base films are commercially available; for instance, examples of the polyimide film include "KAPTON (registered trademark)" manufactured by Du Pont Toray Co., Ltd., "XENOMAX (registered trademark)" manufactured by Toyobo Co., Ltd., "UPILEX (registered trademark)-S" manufactured by Ube Industries, Ltd., and "APICAL (registered trademark)" manufactured by Kaneka Corporation. Examples of the polyethylene naphthalate film include "TEONEX (registered trademark)" manufactured by Teijin DuPont Films Japan Limited. Furthermore, examples of the liquid crystal polymer film include "VECSTAR (registered trademark)" manufactured by Kurary Co., Ltd, and "BIAC (registered trademark)" manufactured by Primatec Co., Ltd. The base film can also be obtained by making a film of desired thickness from the corresponding resin.

When the laminate having an adhesive layer according to the present invention is used as a bonding sheet, the base film should be a release film such as a polyethylene terephthalate film, a polyethylene film, a polypropylene film, a silicone-treated release paper, a polyolefin resin-coated paper, a TPX (polymethylpentene) film, and a fluororesin film.

Such release films are commercially available, and examples thereof include "LUMIRROR (registered trademark)" manufactured by Toray Industries, Inc., "TOYOBO ESTER (registered trademark) film" manufactured by Toyobo Co., Ltd., "AFLEX (registered trademark)" manufactured by Asahi Glass Co., Ltd., and "OPULENT (registered trademark)" manufactured by Mitsui Chemicals Tohcello, Inc.

In order to make thinner the laminate having the adhesive layer, the thickness of the base film is preferably from 5 to 100 nm, more preferably from 5 to 50 nm, and still more preferably from 5 to 30 nm.

(2) Adhesive Layer

The adhesive layer for use in the laminate according to the present invention is formed of an adhesive composition comprising a carboxyl group-containing styrene based elastomer (A) and an epoxy resin (B), wherein the content of the carboxyl group-containing styrene based elastomer (A) is 50 parts by mass or more relative to 100 parts by mass of the solid content of the adhesive composition; the content of the epoxy resin (B) is from 1 to 20 parts by mass relative to 100 parts by mass of the carboxyl group-containing styrene based elastomer (A); and the adhesive layer is in B-stage.

The above carboxyl group-containing styrene based elastomer (A) is one of the main components of the adhesive composition and provides not only adhesiveness and flexibility of cured products but also electrical properties. The carboxyl group-containing styrene based elastomer is one obtained by modifying, with an unsaturated carboxylic acid, copolymers mainly constituted by block and random structures of conjugated diene compounds and aromatic vinyl compounds, or hydrogenated products thereof. Specific examples of the aromatic vinyl compounds include styrene, t-butylstyrene, α-methylstyrene, p-methylstyrene, divinylbenzene, 1,1-diphenylstyrene, N,N-diethyl-p-aminoethylstyrene, vinyltoluene, and p-tert-butylstyrene. Examples of the conjugated diene compounds include butadiene, isoprene, 1,3-pentadiene, and 2,3-dimethyl-1,3-butadiene.

The modification of the carboxyl group-containing styrene based elastomer (A) can be conducted, for instance, by copolymerizing an unsaturated carboxylic acid when a styrene-based elastomer is polymerized. Otherwise, the styrene-based elastomer can be heated and kneaded together with an unsaturated carboxylic acid in the presence of an organic peroxide. Examples of the unsaturated carboxylic acid include acrylic acid, methacrylic acid, maleic acid, itaconic acid, fumaric acid, maleic anhydride, itaconic anhydride, and fumaric anhydride. The amount of the unsaturated carboxylic acid to be used for the modification is preferably from 0.1 to 10 mass %.

The acid value of the carboxyl group-containing styrene based elastomer (A) is preferably from 0.1 to 25 mg KOH/g, and more preferably from 0.5 to 23 mg KOH/g. When the acid value is 0.1 mg KOH/g or more, the adhesive composition can be cured sufficiently to achieve excellent adhesiveness, heat resistance, and resin flow. When the acid value is 25 mg KOH/g or less, excellent adhesion strength and electrical properties can be realized.

The weight average molecular weight of the carboxyl group-containing styrene based elastomer (A) is preferably from 1 to 500,000, more preferably from 3 to 300,000, and still more preferably from 5 to 200,000. When the weight average molecular weight is in the range of from 1 to 500,000, excellent adhesiveness and electrical properties can be exhibited. In the present description, "weight average molecular weight" refers to a molecular weight value determined by gel permeation chromatography (hereinafter referred to as "GPC") with calibration using polystyrene standards.

Specific examples of the carboxyl group-containing styrene based elastomer (A) include those obtained by modifying, with an unsaturated carboxylic acid, styrene-butadiene block copolymers, styrene-ethylenepropylene block copolymers, styrene-butadiene-styrene block copolymers, styrene-isoprene-styrene block copolymers, styrene-ethylenebutylene-styrene block copolymers, styrene-ethylenepropylene-styrene block copolymers, and the like. These carboxyl group-containing styrene based elastomers can be used alone or in combination of two or more. Among the aforementioned copolymers, preferred from the viewpoint of adhesiveness and electrical properties are styrene-ethylenebutylene-styrene block copolymers and styrene-ethylenepropylene-styrene block copolymers. Furthermore, the mass ratio of styrene/ethylenebutylene in the styrene-ethylenebutylene-styrene block copolymers and the mass ratio of styrene/ethylenepropylene in the styrene-ethylenepropylene-styrene block copolymers are preferably in from 10/90 to 50/50 and more preferably from 20/80 to 40/60. The adhesive composition with the mass ratio in this range exhibits excellent adhesive properties.

The content of the carboxyl group-containing styrene based elastomer (A) should be 50 parts by mass or more, and preferably 60 parts by mass or more, relative to 100 parts by mass of the solid content of the adhesive composition. When the content is less than 50 parts by mass, the adhesive layer lacks flexibility and causes warping of the laminate.

The content of the carboxyl group-containing styrene based elastomer (A) is preferably 99 parts by mass or less relative to 100 parts by mass of the solid content of the adhesive composition.

Hereinafter, explanation of another component in the above adhesive composition, i.e., epoxy resin (B), is given. The epoxy resin (B) reacts with the carboxyl group of the above carboxyl group-containing styrene based elastomer (A) to realize high adhesion to adherends and heat resistance of cured products of the adhesive.

Examples of the epoxy resin (B) include, but are not limited to, a bisphenol A type epoxy resin, a bisphenol F type epoxy resin, or a hydrogenated product thereof; glycidyl ester type epoxy resins such as diglycidyl orthophthalate, diglycidyl isophthalate, diglycidyl terephthalate, glycidyl p-hydroxybenzoate, diglycidyl tetrahydrophthalate, diglycidyl succinate, diglycidyl adipate, diglycidyl sebacate, and triglycidyl trimellitate; glycidyl ether type epoxy resins such as ethylene glycol diglycidyl ether, propylene glycol diglycidyl ether, 1,4-butanediol diglycidyl ether, 1,6-hexanediol diglycidyl ether, trimethylolpropane triglycidyl ether, pentaerythritol tetraglycidyl ether, tetraphenylglycidylether ethane, triphenylglycidylether ethane, polyglycidyl ethers of sorbitol, and polyglycidyl ethers of polyglycerol; glycidylamine type epoxy resins such as triglycidyl isocyanurate and tetraglycidyl diaminodiphenylmethane; and linear aliphatic epoxy resins such as epoxidized polybutadiene and epoxidized soybean-oil. Also usable are novolac type epoxy resins such as phenol novolac epoxy resin, o-cresol novolac epoxy resin and bisphenol A novolac epoxy resin.

Furthermore, examples of the epoxy resins include a brominated bisphenol A type epoxy resin, a phosphorus-containing epoxy resin, an epoxy resin having dicyclopentadiene structure, an epoxy resin having naphthalene structure, an anthracene type epoxy resin, a tertiary butylcatechol type epoxy resin, a triphenylmethane type epoxy resin, a tetraphenylethane type epoxy resin, a biphenyl type epoxy resin, and a bisphenol S type epoxy resin. These epoxy resins may be used alone or in combination of two or more.

Among the above epoxy resins, preferred are those having no glycidylamino group because the storage stability of the laminate having an adhesive layer can be improved. Furthermore, because an adhesive composition having excellent electrical properties can be obtained, preferred are epoxy resins having an aliphatic cyclic structure, and more preferred are epoxy resins having a dicyclopentadiene structure.

The epoxy resin for use in the present invention is preferably one having two or more epoxy groups per one molecule, because it reacts with the carboxyl-group containing styrene based elastomer to form a crosslinking structure and realize high thermal resistance. When an epoxy resin having two or more epoxy groups is used, sufficient crosslinking with the carboxyl group-containing styrene based elastomer is formed to establish sufficient thermal resistance.

The content of the epoxy resin (B) should be from 1 to 20 parts by mass relative to 100 parts by mass of the above carboxyl group-containing styrene based elastomer (A). Preferably, the content is from 3 to 15 parts by mass. If the content is less than 1 parts by mass, sufficient adhesiveness or thermal resistance may not be obtained. On the other hand, if the content exceeds 20 parts by mass, peel adhesion strength or electrical properties may be impaired.

In addition to the carboxyl group-containing styrene based elastomer (A) and the epoxy resin (B), the above adhesive composition may contain, for instance, a thermoplastic resin other than the carboxyl group-containing styrene based elastomer (A), a tackifier, a flame retardant, a curing agent, a curing accelerator, a coupling agent, an anti-thermal aging agent, a leveling agent, an antifoaming agent, an inorganic filler, a pigment, and a solvent in amounts not affecting the function of the adhesive composition.

Examples of the above other thermoplastic resins include phenoxy resins, polyamide resins, polyester resins, polycarbonate resins, polyphenylene oxide resins, polyurethane resins, polyacetal resins, polyethylene resins, polypropylene resins, and polyvinyl resins. These thermoplastic resins may be used either alone or in combination of two or more.

Examples of the above tackifiers include coumarone-indene resins, terpene resins, terpene-phenol resins, rosin resins, p-t-butylphenol-acetylene resins, phenol-formaldehyde resins, xylene-formaldehyde resins, petroleum-based hydrocarbon resins, hydrogenated hydrocarbon resins, and turpentine-based resins. These tackifiers may be used alone or in combination of two or more.

The flame retardant may be either an organic flame retardant or an inorganic flame retardant. Examples of organic flame retardants include phosphorus based flame retardants such as melamine phosphate, melamine polyphosphate, guanidine phosphate, guanidine polyphosphate, ammonium phosphate, ammonium polyphosphate, ammonium phosphate amide, ammonium polyphosphate amide, carbamoyl phosphate, carbamoyl polyphosphate, aluminum trisdiethylphosphinate, aluminum trismethylethylphosphinate, aluminum trisdiphenylphosphinate, zinc bis diethylphosphinate, zinc bismethylethylphosphinate, zinc bis diphenylphosphinate, titanyl bisdiethylphosphinate, titanium tetrakisdiethylphosphinate, titanyl bismethylethylphosphinate, titanium tetrakismethylethylphosphinate, titanyl bis diphenylphosphinate, and titanium tetrakisdiphenylphosphinate; nitrogen based flame retardants which includes triazine compounds such as melamine, melam, and melamine cyanurate, cyanuric acid compounds, isocyanuric acid compounds, triazole compounds, tetrazole compounds, diazo compounds, and urea; and silicon based flame retardants such as silicone compounds and silane compounds. Examples of the inorganic flame retardants include metal hydroxides such as aluminum hydroxide, magnesium hydroxide, zirconium hydroxide, barium hydroxide, and calcium hydroxide; metal oxides such as tin oxide, aluminum oxide, magnesium oxide, zirconium oxide, zinc oxide, molybdenum oxide, and nickel oxide; zinc carbonate, magnesium carbonate, barium carbonate, zinc borate, and hydrated glass. These flame retardants may be used in combination of two or more.

Examples of the above curing agents include, but not limited thereto, amine-based curing agents and acid anhydride-based curing agents. Amine-based curing agents include, for instance, melamine resins such as methylated melamine resin, butylated melamine resin, and benzoguanamine resin; dicyandiamide, and 4,4'-diphenyldiaminosulfone. Acid anhydrides include, for example, aromatic acid anhydrides and aliphatic acid anhydrides. These curing agents may be used alone or in combination of two or more.

The content of the curing agent is preferably from 1 to 100 parts by mass, more preferably from 5 to 70 parts by mass, relative to 100 parts by mass of the epoxy resin (B).

The above curing accelerator is used for the purpose of accelerating the reaction of the carboxyl group-containing styrene based elastomer and the epoxy resin. Usable as the curing accelerator are tertiary amine-based curing accelerator, tertiary amine salt based curing accelerator, and imidazole based curing accelerator.

Examples of the tertiary amine-based curing accelerator include benzyldimethylamine, 2-(dimethylaminomethyl) phenol, 2,4,6-tris(dimethylaminomethyl)phenol, tetramethylguanidine, triethanolamine, N,N'-dimethylpiperadine, triethylenediamine, and 1,8-diazabicyclo[5.4.0] undecene.

Examples of the tertiary amine salt based curing accelerator include a formic acid salt, an octylic acid salt, a p-tofuenesulfonic acid salt, an o-phthalic acid salt, a phenol salt or a phenol novolac resin salt of 1,8-diazabicyclo[5.4.0] undecene, as well as a formic acid salt, an octylic acid salt, a p-toluenesulfonic acid salt, an o-phthalic acid salt, a phenol salt or a phenol novolac resin salt of 1,5-diazabicyclo [4.3.0] nonene.

Examples of the imidazole based curing accelerator include 2-methylimidazole, 2-undecylimidazole, 2-heptadecylimidazole, 1,2-dimethylimidazole, 2-methyl-4-ethylimidazole, 2-phenylimidazole, 2-phenyl-4-methylimidazole, 1-benzyl-2-methylimidazole, 1-benzyl-2-phenylimidazole, 2,4-diamino-6-[2'-methylimidazolyl-(1')] ethyl-s-triazine, 2,4-diamino-6-[2'-undecylimidazolyl-(1')] ethyl-s-triazine, 2,4-diamino-6-[2'-ethyl-4'-methylimidazolyl-(1')]ethyl-s-triazine, 2,4-diamino-6-[2'-methylimidazolyl-(1')]ethyl-s-triazine isocyanurate adduct, 2-phenylimidazole isocyanurate adduct, 2-phenyl-4,5-dihydroxymethylimidazole, and 2-phenyl-4-methyl-5-hydroxymethylimidazole. These curing accelerators may be used alone or in combination of two or more.

When the curing accelerator is contained in the adhesive composition, the content of the curing accelerator is preferably 1 to 10 parts by mass, more preferably 2 to 5 parts by mass, relative to 100 parts by mass of the epoxy resin (B). Excellent adhesiveness and thermal resistance can be exhibited so long as the content of the curing accelerator is in the aforementioned range.

Examples of the coupling agents include silane-based coupling agents such as vinyltrimethoxysilane, 3-glycydoxypropyltrimethoxysilane, p-styryltrimethoxysilane, 3-methacryloxypropylmethyldimethoxysilane, 3-acryloxypropyltrimethoxysilane, N-2-(aminoethyl)-3-aminopropylmethyldimethoxysilane, 3-ureidopropyltriethoxysilane, 3-mercaptopropylmethyldimethoxysilane, bis(triethoxysilylpropyl)tetrasulfide, 3-isocyanatopropyltriethoxysilane, and imidazolesilane; titanate-based coupling agents, aluminate-based coupling agents, and zirconium-based coupling agents. These may be used alone or in combination of two or more.

Examples of the anti-thermal aging agents include phenol-based antioxidants such as 2,6-di-tert-butyl-4-methylphenol, n-octadecyl-3-(3',5'-di-tert-butyl-4'-hydroxyphenyl)propionate, tetrakis[methylene-3-(3,5-di-tert-butyl-4-hydroxyphenyl)propionate]methane, pentaerythritol tetrakis [3-(3,5-di-tert-butyl-4-hydroxyphenol, and triethylene glycol bis[3-(3-tert-butyl-4-hydroxy-5-methylphenyl)propionate; sulfur-based antioxidants such as dilauryl 3,3'-thiodipropionate, and dimyristyl 3,3'-dithiopropionate; and phosphorus-based antioxidants such as tris(nonylphenyl) phosphite, and tris(2,4-di-tert-butylphenyl) phosphite. These may be used alone or in combination of two or more.

Examples of the inorganic fillers include powders of titanium oxide, aluminum oxide, zinc oxide, carbon black, silica, talc, copper, and silver. These may be used alone or in combination of two or more.

The adhesive composition can be produced by mixing the carboxyl group-containing styrene based elastomer (A), the epoxy resin (B), and other components. The mixing method is not specifically limited so long as a uniform adhesive composition is obtained. Since the adhesive composition is preferably used in the form a solution or a dispersion, a solvent is generally employed. Examples of the solvents include alcohols such as methanol, ethanol, isopropyl alcohol, n-propyl alcohol, isobutyl alcohol, n-butyl alcohol, benzyl alcohol, ethylene glycol monomethyl ether, propylene glycol monomethyl ether, diethylene glycol monomethyl ether, and diacetone alcohol; ketones such as acetone, methyl ethyl ketone, methyl isobutyl ketone, methyl amyl ketone, cyclohexanone, and isophorone; aromatic hydrocarbons such as toluene, xylene, ethylbenzene, and mesitylene; esters such as methyl acetate, ethyl acetate, ethylene glycol monomethyl ether acetate, and 3-methoxybutyl acetate; and aliphatic hydrocarbons such as hexane, heptane, cyclohexane, and methylcyclohexane. These solvents may be used alone or in combination of two or more. When the adhesive composition is a solution or a dispersion (resin varnish) containing a solvent, the application to the base film and the formation of the adhesive layer can be smoothly carried out to readily obtain an adhesive layer at a desired thickness.

When the adhesive composition contains a solvent, the solid concentration is preferably from 3 to 80 mass %, and more preferably 10 to 50 mass %, from the viewpoint of, for example, workability including formation of the adhesive layer. If the solid concentration is 80 mass % or less, a solution with a favorable viscosity can be obtained to facilitate uniform coating.

(3) The Laminate Having an Adhesive Layer

An embodiment of the laminate having an adhesive layer according to the present invention includes a coverlay film. A coverlay film comprises the aforementioned adhesive layer which is formed on at least one of the surfaces of a base film, and the adhesive layer cannot be easily peeled off from the base film.

The coverlay film can be produced, for example, by coating a surface of a base film such as a polyimide film with a resin varnish containing the above adhesive composition and a solvent to form a resin varnish layer, and then removing the solvent from the resin varnish layer to obtain a coverlay film having an adhesive layer in B stage. Herein, the "adhesive layer in B stage" refers to a semi-cured state in which a part of the adhesive composition starts curing, so that the curing of the adhesive composition further proceeds by heating or the like.

The drying temperature to remove the solvent is preferably from 40 to 250° C., and more preferably from 70 to 170° C. The drying process is carried out by passing the laminate having the adhesive composition coated thereon through a furnace in which hot air drying, far infrared heating, high frequency induction heating or the like is carried out.

Furthermore, if necessary, a release film may be laminated onto the surface of the adhesive layer for preservation and the like. Examples of the release film include those known in the art, such as a polyethylene terephthalate film, a polyethylene film, a polypropylene film, a silicone-treated release paper, a polyolefin resin-coated paper, a TPX film, and a fluororesin film.

Another embodiment of the laminate having an adhesive layer includes a bonding sheet. The bonding sheet comprises the aforementioned adhesive layer formed on the surface of a release film (base film). In another embodiment of the bonding sheet, the adhesive layer may be incorporated between two release films. The release film is peeled off when the bonding sheet is used. Examples of the release film are those mentioned above.

The bonding sheet can be produced by, for instance, coating the surface of a release film with a resin varnish containing the adhesive composition and a solvent, followed by drying in the same manner as in the case of the aforementioned coverlay film.

The thickness of the adhesive layer in B stage is preferably from 5 to 100 μm, more preferably from 10 to 70 μm, and still more preferably 10 to 50 μm.

Although the thicknesses of the above base film and adhesive layer are selected depending on usage, the base film tend to be thinner to improve electrical properties. In general, warpage of the laminate having an adhesive layer tends to occur and impairs workability with decreasing the thickness of the base film and increasing the thickness of the adhesive layer. However, the laminate having an adhesive layer according to the present invention hardly causes the warpage of the laminate even when the base film is thin and the adhesive layer is thick. In the laminate having an adhesive layer according to the present invention, the ratio of the thickness of the adhesive layer (A) to the thickness of the base film (B), i.e., (A/B), is preferably not less than 1 and not more than 10, and more preferably not less than 1 and not more than 5. Further, it is preferred that the thickness of the adhesive layer is larger than the thickness of the base film.

It is preferred that the warpage of the laminate having an adhesive layer is as small as possible because the warpage affects workability in the production process of FPC-related products. More specifically, when a square-shaped laminate having an adhesive layer is placed on a horizontal surface with the adhesive layer facing up, the ratio (H/L) wherein H is an elevation of an edge of the laminate and L is a side length of the laminate is preferably less than 0.05. The ratio is more preferably less than 0.04, and still more preferably less than 0.03. When the ratio (H/L) is less than 0.05, a laminate with excellent workability can be obtained because the warpage or curling of the laminate can be suppressed.

Additionally, the lower limit of the H/L is 0, i.e., when H is 0.

The laminate having the adhesive layer preferably yields a dielectric constant (ε) lower than 3.0 and a dielectric loss tangent (tan δ) lower than 0.01 when measured at a frequency of 1 GHz after the adhesive layer of the laminate is cured. More preferably, the dielectric constant is 2.9 or lower, and the dielectric loss tangent is 0.005 or lower. The laminate can be favorably used in FPC-related products which must meet strict electrical property requirements so long as the laminate yields a dielectric constant lower than 3.0 and a dielectric loss tangent lower than 0.01. Since the dielectric constant and the dielectric loss tangent can be adjusted by the type and content of the adhesive component or the type of the base film and the like, various types of laminates can be designed depending on the usage. The method of measuring the dielectric constant and the dielectric loss tangent is described hereinafter.

Furthermore, it is preferred that the laminate having the adhesive layer yields a dielectric constant (ε) of 2.2 or more and a dielectric loss tangent (tan δ) of 0 or more as measured at a frequency of 1 GHz after the adhesive layer of the laminate is cured.

2. Flexible Copper Clad Laminate

The flexible copper clad laminate according to the present invention is characterized in that a base film and a copper foil are bonded to each other using the aforementioned laminate having an adhesive layer. That is, the flexible copper clad laminate according to the present invention comprises a base film, an adhesive layer, and a copper foil in this order. The adhesive layer and the copper foil may be formed on both surfaces of the base film. Since the adhesive composition for use in the present invention is excellent in adhesion to articles containing copper, the flexible copper clad laminate according to the present invention is provided as an integrated product excellent in stability.

The method for producing the flexible copper clad laminate according to the present invention includes, for instance, a method in which the surface of the adhesive layer of the laminate is brought in contact with the copper foil, hot lamination is carried out at from 80 to 150° C., and then the adhesive layer is cured by after-curing. The after-curing conditions can be, for example, at from 100 to 200° C. for from 30 minutes to 4 hours. There is no particular limitation on the copper foil, and usable are electrolytic copper foil, rolled copper foil, and the like.

3. Flexible Flat Cable (FFC)

The flexible flat cable according to the present invention is characterized in that a base film and a copper wiring are bonded to each other using the aforementioned laminate having an adhesive layer. That is, the flexible flat cable according to the present invention comprises a base film, an adhesive layer, and a copper wiring in this order. The adhesive layer and the copper wiring may be formed on both surfaces of the base film. Since the adhesive composition for use in the present invention is excellent in adhesion to articles containing copper, the flexible flat cable according to the present invention is provided as an integrated product excellent in stability.

The method for producing the flexible flat cable according to the present invention includes, for instance, a method in which the adhesive layer of the laminate is brought in contact with the copper wiring, hot lamination is carried out at from 80 to 150° C., and then the adhesive layer is cured by after-curing. The after-curing condition can be, for example, at from 100 to 200° C. for from 30 minutes to 4 hours. There is no particular limitation on the shape of the copper wiring, so the shape and the like can be properly selected as desired.

EXAMPLES

The present invention is explained in further detail by way of Examples below, but the present invention is not limited thereto. In the explanation below, parts and % are on mass basis unless otherwise stated.

1. Evaluation Method (1) Molecular Weight

Instrument: Alliance2695 (manufactured by Waters)
Column: 2 columns of TSK gel SuperMultiporeHZ-H
2 columns of TSK gel SuperHZ2500
(manufactured by Tosoh Corporation)
Column temperature: 40° C.
Carrier solvent: Tetrahydrofuran 0.35 ml/min
Detector: RI (Differential Refractive Index Detector)

The molecular weight measured by GPC was converted based on polystyrene molecular weight standard.

(2) Warpage

A 25-μm thick polyimide film (200 mm length×200 mm width) was prepared, and the liquid adhesive compositions listed in Tables 1 and 2 were each applied by roll-coating to one of the surfaces of the film. The coated film was then allowed to stand still in an oven, and was dried at 90° C. for 3 minutes to form a 25-μm thick adhesive layer in B stage to obtain a coverlay film A1 (a 50-μm thick laminate having the adhesive layer). The resulting coverlay film A1 was placed on a horizontal plane with the adhesive layer facing upward, and the elevation in the vertical direction was measured at each of the four corners. The thus-measured elevations at the four corners were averaged, and the ratio of the average elevation (H) to the side length (L) of the laminate, i.e., H/L, was obtained and used to evaluate the warpage.

Further, a coverlay film B1 (a 50-μm thick laminate having the adhesive layer) was prepared in the same manner as above, except for changing the thickness of the polyimide film to 12.5 μm and the thickness of the adhesive layer to 37.5 μm, and was subjected to evaluation.

<Evaluation Criteria>
⊚: H/L is lower than 0.020
○: H/L is 0.030 or more and lower than 0.05
x: H/L is 0.10 or more (3) Peel Adhesion Strength A 25-μm thick polyimide film was prepared, and the liquid adhesive compositions listed in Tables 1 and 2 were each applied by roll-coating to one of the surfaces of the film. The coated film was then allowed to stand still in an oven, and was dried at 90° C. for 3 minutes to form a 25-μm thick adhesive layer in B stage to obtain a coverlay film (a laminate having the adhesive layer). Then, a 35-μm thick rolled copper foil was brought into surface contact with the surface of the adhesive layer of the coverlay film, and the resultant was subjected to lamination under a temperature of 120° C., a pressure of 0.4 MPa, and a speed of 0.5 m/minute. Then, the resulting laminate (polyimide film/adhesive layer/copper foil) was subjected to hot pressing at a temperature of 180° C. and a pressure of 3 MPa for 30 minutes to obtain a flexible copper clad laminate A. The thus-obtained flexible copper clad laminate A was cut into a specified size to prepare an adhesion test piece.

Further, a flexible copper clad laminate B was prepared in the same manner as above, except for changing the thickness of the polyimide film to 12.5 μm and the thickness of the adhesive layer to 37.5 μm, to prepare an adhesion test piece.

In accordance with JIS C 6481 "Test methods of copper-clad laminates for printed wiring boards", adhesiveness was evaluated by measuring a 180° peel adhesion strength (N/mm) when the copper foil of each adhesion test piece was peeled off from the polyimide film under a temperature of 23° C. and a tensile speed of 50 mm/minute. The width of the adhesion test piece at the time of measurement was 10 mm.

(4) Solder Heat Resistance

The test was conducted in accordance with JIS C 6481 "Test methods of copper-clad laminates for printed wiring boards". The adhesion test pieces were each cut into 25-mm square, and were subjected to heat treatment at 120° C. for 30 minutes. Then, with the polyimide film facing up, the adhesion test pieces were floated on a solder bath for 10 seconds at a predetermined temperature to observe foaming on the surface of the adhesion test pieces. The maximum temperature at which no foaming was observed on the adhesion test piece was taken as the temperature of solder heat resistance.

(5) Resin Flow

A 25-μm thick polyimide film was prepared, and the liquid adhesive compositions listed in Tables 1 and 2 were each applied by roll-coating to one of the surfaces of the film. The coated film was then allowed to stand still in an oven, and was dried at 90° C. for 3 minutes to form a 25-μm thick adhesive layer in B stage to obtain a coverlay film (a laminate having the adhesive layer). Then, after punching a hole of 6-mm in diameter from the surface of the adhesive layer in the coverlay film, a 35-μm thick rolled copper foil was layered thereon, and the resultant was subjected to lamination under a temperature of 120° C., a pressure of 0.4 MPa, and a speed of 0.5 m/minute. The resulting laminate A (polyimide film/adhesive layer/copper foil) was subjected to hot pressing at a temperature of 180° C. and a pressure of 3 MPa for 30 minutes. In this instance, the maximum length of the adhesive protruding into the hole of the polyimide was measured. It was determined that the shorter the protruding length was, the better the resin flow was, and the greater the protruding length was, the worse the resin flow was.

Further, a laminate B was prepared and evaluated in the same manner as above, except for changing the thickness of the polyimide film to 12.5 μm and the thickness of the adhesive layer to 37.5 μm.

(6) Electrical Properties (Dielectric Constant and Dielectric Loss Tangent)

A 25-μm thick polyimide film was prepared, and the liquid adhesive compositions listed in Tables 1 and 2 were each applied by roll-coating to one of the surfaces of the film. The coated film was then allowed to stand still in an oven, and was dried at 90° C. for 3 minutes to form a 25-μm thick adhesive layer in B stage to obtain a coverlay film A2 (a 50-μm thick laminate having the adhesive layer). The resulting coverlay film A2 was then allowed to stand still in an oven, and was heated and cured at 180° C. for 30 minutes to obtain a test piece of 120 mm×100 mm in size.

Further, a coverlay film B2 (a 50-μm thick laminate having the adhesive layer) was prepared in the same manner as above, except for changing the thickness of the polyimide film to 12.5 μm and the thickness of the adhesive layer to 37.5 μm. The resultant was subjected to heat curing treatment at 180° C. for 30 minutes to obtain a test piece of 120 mm×100 mm in size.

The dielectric constant (ε) and the dielectric loss tangent (tan δ) of the laminate having an adhesive layer were measured using a network analyzer 85071E-300 (manufactured by Agilent Technologies, Inc.) in accordance with the split post dielectric resonator (SPDR) method, at a temperature of 23° C. and at a frequency of 1 GHz.

(7) Storage Stability of the Laminate Having an Adhesive Layer

A coverlay film A2 (a 50-μm thick laminate having the adhesive layer) prepared in the same manner as in the aforementioned (6) "Electrical properties" was stored at 23° C. for a predetermined duration of time, and the coverlay film A2 after storage was subjected to hot pressing with a copper single-sided board (L/S=50 μm/50 μm, having copper thickness of 18 μm) at a temperature of 180° C. and a pressure of 3 MPa for 3 minutes to evaluate a filling property of the resin. The storage period of time at which the resin no longer fills in the substrate was taken for evaluation.

<Evaluation Criteria>
 ○: 2 months or longer
 Δ: 1 week or longer and less than 1 month
 x: less than 1 week 2. Raw Materials of the Adhesive Composition 2-1. Styrene-Based Resin (1) Styrene-Based Elastomer a1

A maleic acid modified styrene-ethylenebutylene-styrene block copolymer "TUFTEC M1913" (a trade name of a product manufactured by Asahi Kasei Corporation) was used. The acid value of the copolymer is 10 mg KOH/g, the styrene/ethylenebutylene ratio is 30/70, and the weight average molecular weight is 150,000.

(2) Styrene-Based Elastomer a2

A maleic acid modified styrene-ethylenebutylene-styrene block copolymer "TUFTEC M1911" (a trade name of a product manufactured by Asahi Kasei Corporation) was used. The acid value of the copolymer is 2 mg KOH/g, the styrene/ethylenebutylene ratio is 30/70, and the weight average molecular weight is 150,000.

(3) Styrene-Based Elastomer α

A styrene-ethylenebutylene-styrene block copolymer "TUFTEC H1041" (a trade name of a product manufactured by Asahi Kasei Corporation) was used. The acid value of the copolymer is 0 mg KOH/g, the styrene/ethylenebutylene ratio is 30/70, and the weight average molecular weight is 150,000.

(4) Styrene-Containing Oligomer

"OPE-St resin" (trade name) manufactured by Mitsubishi Gas Chemical Company, Inc., was used.

2-2. Epoxy Resin (1) Epoxy Resin b1

An epoxy resin having a dicyclopentadiene structure, "EPICLON HP-7200" (trade name) manufactured by DIC Corporation, was used.

(2) Epoxy Resin b2

A cresol novolac epoxy resin, "EPICLON N-655 EXP" (trade name), manufactured by DIC Corporation, was used.

(3) Epoxy Resin b3

A glycidylamino based epoxy resin, "TETRAD-C" (trade name), manufactured by Mitsubishi Gas Chemical Company, Inc., was used.

2-3. Others
(1) Curing Accelerator
An imidazole-based curing accelerator "CURESOL C11-Z" (trade name), manufactured by Shikoku Chemicals Corporation was used.
(2) Inorganic Filler 1
Silica, "EXCELICA SE-1" (trade name), manufactured by Tokuyama Corporation was used.
(3) Inorganic Filler 2
"OP-935" (trade name), manufactured by Clariant Japan was used.
(4) Solvent
A mixed solvent constituted by toluene and methyl ethyl ketone at a mass ratio of 90:10 was used.

3. Preparation of the Adhesive Composition
The above raw materials were put into a 1000-ml flask equipped with a stirrer in the proportion shown in Tables 1 and 2, and were dissolved under stirring for 6 hours at room temperature to obtain a liquid adhesive composition containing 20% of solid content.

4. Preparation and Evaluation of the Laminate Having an Adhesive Layer

Examples 1 to 8 and Comparative Examples 1 to 5

Laminates having an adhesive layer were each prepared using the above adhesive compositions, and were subjected to evaluation. The results are given in Tables 1 and 2.

TABLE 1

|  |  | Examples |  |  |  |  |  |  |  |
|---|---|---|---|---|---|---|---|---|---|
|  |  | 1 | 2 | 3 | 4 | 5 | 6 | 7 | 8 |
| Adhesive Composition (parts by mass) | Styrene-based elastomer a1 | 100 | 100 | 100 | 100 | 100 | 100 | 80 | |
|  | Styrene-based elastomer a2 | | | | | | | | 100 |
|  | Styrene-containing oligomer | | | | | | | 20 | |
|  | Epoxy resin b1 | 6 | 7 | 5 | 15 | | | 6 | 4 |
|  | Epoxy resin b2 | | | | | 6 | | | |
|  | Epoxy resin b3 | | | | | | 6 | | |
|  | Curing accelerator | 0.2 | 0.2 | 0.2 | 0.5 | 0.2 | 0.2 | 0.2 | 0.2 |
|  | Inorganic filler 1 | | 15 | | | | | | |
|  | Inorganic filler 2 | | | 30 | | | | | |
|  | Solvent | 400 | 400 | 450 | 450 | 400 | 400 | 400 | 400 |
| Results of Evaluation | Warpage of coverlay film A1 | ◎ | ◎ | ◎ | ◎ | ◎ | ◎ | ○ | ◎ |
|  | Peel adhesion strength of flexible copper clad laminate A (N/mm) | 1.0 | 1.3 | 0.9 | 0.9 | 1.0 | 1.0 | 1.0 | 1.4 |
|  | Solder heat resistance of flexible copper clad laminate A (° C.) | 360 | 360 | 330 | 360 | 360 | 360 | 360 | 300 |
|  | Resin flow of laminate A (mm) | 0.20 | 0.05 | 0.05 | 0.15 | 0.15 | 0.20 | 0.10 | 0.10 |
|  | Dielectric constant ($\varepsilon$) of coverlay film A2 | 2.8 | 2.9 | 2.9 | 2.9 | 2.9 | 2.8 | 2.9 | 2.8 |
|  | Dielectric loss tangent (tan $\delta$) of coverlay film A2 | 0.004 | 0.004 | 0.005 | 0.004 | 0.005 | 0.004 | 0.005 | 0.004 |
|  | Storage stability of coverlay film A2 | ○ | ○ | ○ | ○ | ○ | △ | ○ | ○ |
|  | Warpage of coverlay film B1 | ◎ | ○ | ○ | ◎ | ◎ | ◎ | ○ | ◎ |
|  | Peel adhesion strength of flexible copper clad laminate B (N/mm) | 1.1 | 1.5 | 1.0 | 1.0 | 1.1 | 1.1 | 1.1 | 1.6 |
|  | Solder heat resistance of flexible copper clad laminate B (° C.) | 360 | 360 | 330 | 360 | 360 | 360 | 360 | 300 |
|  | Resin flow of laminate B (mm) | 0.25 | 0.15 | 0.2 | 0.2 | 0.2 | 0.25 | 0.15 | 0.15 |
|  | Dielectric constant ($\varepsilon$) of coverlay film B2 | 2.6 | 2.7 | 2.7 | 2.6 | 2.7 | 2.6 | 2.7 | 2.6 |
|  | Dielectric loss tangent (tan $\delta$) of coverlay film B2 | 0.003 | 0.003 | 0.005 | 0.004 | 0.005 | 0.003 | 0.005 | 0.003 |

TABLE 2

|  |  | Comparative Examples |  |  |  |  |
|---|---|---|---|---|---|---|
|  |  | 1 | 2 | 3 | 4 | 5 |
| Adhesive Composition (parts by mass) | Styrene-based elastomer a1 | | 50 | 100 | 100 | |
|  | Styrene-based elastomer α | 50 | | | | 100 |
|  | Styrene-containing oligomer | 50 | 50 | | | |
|  | Epoxy resin b1 | 6 | 6 | 25 | 50 | 7 |
|  | Curing accelerator | 0.2 | 0.2 | 1 | 2 | 0.2 |
|  | Inorganic filler 2 | 30 | | | | |
|  | Solvent | 450 | 450 | 450 | 500 | 400 |
| Results of Evaluation | Warpage of coverlay film A1 | X | X | ○ | ○ | ◎ |
|  | Peel adhesion strength of flexible copper clad laminate A (N/mm) | 1.1 | 1.1 | 0.4 | 0.3 | 0.6 |
|  | Solder heat resistance of flexible copper clad laminate A (° C.) | 330 | 360 | 360 | 360 | 260 |
|  | Resin flow of laminate A (mm) | 0.10 | 0.10 | 0.20 | 0.05 | 0.75 |
|  | Dielectric constant ($\varepsilon$) of coverlay film A2 | 3.0 | 3.0 | 3.0 | 3.1 | 2.8 |
|  | Dielectric loss tangent (tan $\delta$) of coverlay film A2 | 0.005 | 0.005 | 0.006 | 0.009 | 0.004 |
|  | Storage stability of coverlay film A2 | ○ | ○ | ○ | ○ | ○ |
|  | Warpage of coverlay film B1 | X | X | ○ | ○ | ◎ |
|  | Peel adhesion strength of flexible copper clad laminate B (N/mm) | 1.2 | 1.2 | 0.5 | 0.4 | 0.7 |
|  | Solder heat resistance of flexible copper clad laminate B (° C.) | 330 | 360 | 360 | 360 | 260 |

TABLE 2-continued

|  | Comparative Examples | | | | |
| --- | --- | --- | --- | --- | --- |
|  | 1 | 2 | 3 | 4 | 5 |
| Resin flow of laminate B (mm) | 0.15 | 0.15 | 0.25 | 0.1 | 0.9 |
| Dielectric constant (ε) of coverlay film B2 | 2.9 | 2.8 | 2.8 | 2.9 | 2.6 |
| Dielectric loss tangent (tan δ) of coverlay film B2 | 0.005 | 0.005 | 0.006 | 0.01 | 0.003 |

The results in the above Tables 1 and 2 shows that the laminates having an adhesive layer obtained in Examples 1 to 8 exhibit little warpage; and therefore are satisfactory in workability in manufacturing processes of FPC-related products. Furthermore, it can be readily understood that these laminates having an adhesive layer show excellent adhesiveness, resin flow, and electrical properties. On the other hand, Comparative Examples 1 and 5 in which no carboxyl group-containing styrene-based elastomer was used as a styrene based resin were low in adhesiveness and thermal resistance. Further, Comparative Example 2 in which the content of the carboxyl group-containing styrene-based elastomer was too low suffered from warpage. Furthermore, Comparative Examples 3 and 4 in which the content of the epoxy resin was outside the range specified in the present invention were deficient in adhesiveness and electrical properties.

INDUSTRIAL APPLICABILITY

The laminate having an adhesive layer according to the present invention exhibits little warpage even when the base film is thin; therefore the laminate is excellent in workability. Furthermore, the laminate is suitable for producing FPC-related products because it shows excellent adhesiveness, resin flow, and electrical properties.

The invention claimed is:

1. A laminate having an adhesive layer, which comprises a base film; and
an adhesive layer formed on at least one of the surfaces of the base film, wherein the adhesive layer is formed of an adhesive composition comprising
(A) a carboxyl group-containing styrene-based elastomer,
(B) an epoxy resin, and
(C) a curing accelerator,
with the proviso the adhesive composition has no epoxy resin having a glycidylamino group,
wherein the content of the carboxyl group-containing styrene-based elastomer (A) is 50 parts by mass or more relative to 100 parts by mass of the solid content of the adhesive composition, the content of the epoxy resin (B) is 1 to 20 parts by mass relative to 100 parts by mass of the carboxyl group-containing styrene-based elastomer (A), the adhesive layer is in B-stage, and the carboxyl group-containing styrene-based elastomer (A) has an acid value of from 0.1 to 25 mg KOH/g.

2. The laminate having an adhesive layer according to claim 1, wherein the adhesive layer is formed by coating a resin varnish comprising the adhesive composition and a solvent on a surface of the base film to form a resin varnish layer, and then removing the solvent from the resin varnish layer.

3. The laminate having an adhesive layer according to claim 1, wherein the laminate has a ratio (H/L) of less than 0.05, wherein H is an elevation of an edge of the laminate and L is a side length of the laminate when the laminate having an adhesive layer is square-shaped and placed on a horizontal surface with the adhesive layer facing up.

4. The laminate having an adhesive layer according claim 1, wherein the base film is at least one film selected from the group consisting of a polyimide film, a polyether ether ketone film, a polyphenylene sulfide film, an aramid film, a polyethylene naphthalate film, a liquid crystal polymer film, a polyethylene terephthalate film, a polyethylene film, a polypropylene film, a silicone-treated release paper, a polyolefin resin-coated paper, a TPX film, and a fluororesin film.

5. The laminate having an adhesive layer according to claim 1, wherein the base film has a thickness from 5 to 100 μm.

6. The laminate having an adhesive layer according to claim 1, wherein the carboxyl group-containing styrene-based elastomer (A) is obtained by modifying at least one styrene-based elastomer selected from the group consisting of styrene-butadiene block copolymers, styrene-ethylenepropylene block copolymers, styrene-butadiene-styrene block copolymers, styrene-isoprene-styrene block copolymers, styrene-ethylenebutylene-styrene block copolymers, and styrene-ethylenepropylene-styrene block copolymers with an unsaturated carboxylic acid.

7. The laminate having an adhesive layer according to claim 1, wherein the epoxy resin (B) is a multifunctional epoxy resin having an alicyclic structure.

8. The laminate having an adhesive layer according to claim 7, wherein the alicyclic structure is a dicyclopentadiene structure.

9. The laminate having an adhesive layer according to claim 1, wherein the adhesive layer has a thickness of from 5 to 100 μm.

10. The laminate having an adhesive layer according to claim 1, wherein the adhesive layer has a thickness equal to or thicker than the thickness of the base film.

11. The laminate having an adhesive layer according to claim 1, wherein said laminate exhibits a dielectric constant lower than 3.0 and a dielectric loss tangent lower than 0.01, as measured at a frequency of 1 GHz after curing the adhesive layer.

12. A flexible copper clad laminate which comprises a laminate according to claim 1 and a copper foil bonded onto the adhesive layer of the laminate.

13. A flexible flat cable which comprises a laminate according to claim 1 and a copper wiring bonded onto the adhesive layer of the laminate.

14. The laminate having an adhesive layer according to claim 1, wherein the base film is at least one film selected from the group consisting of a polyimide film, a polyether ether ketone film, a polyphenylene sulfide film, an aramid film, a polyethylene naphthalate film, a liquid crystal polymer film, a polyethylene terephthalate film, a polyethylene film, a polypropylene film, a silicone-treated release paper, a polyolefin resin-coated paper, a TPX film, and a fluororesin film; wherein the base film has a thickness of from 5 to 100 μm; wherein the adhesive layer has a thickness of from 5 to 100 μm that is equal to or greater than the thickness of the base film; and wherein the laminate has a ratio (H/L) of less than 0.05, in which H is an elevation of an edge of the laminate and L is a side length of the laminate when the laminate having an adhesive layer is square-shaped and placed on a horizontal surface with the adhesive layer facing up.

15. The laminate having an adhesive layer according to claim 1, wherein the carboxyl group-containing styrene-based elastomer (A) has an acid value of from 0.5 to 23 mg KOH/g.

16. The laminate having an adhesive layer according to claim 1, wherein the carboxyl group-containing styrene-based elastomer (A) has an acid value of 0.1 mg KOH/g to 10 mg KOH/g.

17. The laminate having an adhesive layer according to claim 1, wherein the carboxyl group-containing styrene-based elastomer (A) has an acid value of 0.5 mg KOH/g to 10 mg KOH/g.

18. The laminate having an adhesive layer according to claim 1, wherein the content of the curing accelerator is 1 to 10 parts by mass relative to 100 parts by mass of the epoxy resin (B).

19. The laminate having an adhesive layer according to claim 1, wherein the content of the curing accelerator is 2 to 5 parts by mass relative to 100 parts by mass of the epoxy resin (B).

20. The laminate having an adhesive layer according to claim 1, wherein the curing accelerator comprises a tertiary amine-based curing accelerator, tertiary amine salt-based curing accelerator, or an imidazole-based curing accelerator.

21. The laminate having an adhesive layer according to claim 1, wherein the curing accelerator comprises a tertiary amine-based curing accelerator.

22. The laminate having an adhesive layer according to claim 1, wherein the curing accelerator comprises a tertiary amine salt-based curing accelerator.

23. The laminate having an adhesive layer according to claim 1, wherein the curing accelerator comprises imidazole-based curing accelerator.

* * * * *